(12) United States Patent
Van Bentum et al.

(10) Patent No.: US 8,158,486 B2
(45) Date of Patent: Apr. 17, 2012

(54) TRENCH ISOLATION STRUCTURE HAVING DIFFERENT STRESS

(75) Inventors: Ralf Van Bentum, Moritzburg (DE); Klaus Hempel, Dresden (DE); Roland Stejskal, Freital (DE)

(73) Assignee: Advanced Micro Devices, Inc., Austin, TX (US)

( * ) Notice: Subject to any disclaimer, the term of this patent is extended or adjusted under 35 U.S.C. 154(b) by 688 days.

(21) Appl. No.: 11/537,809

(22) Filed: Oct. 2, 2006

(65) Prior Publication Data

US 2007/0155122 A1 Jul. 5, 2007

(30) Foreign Application Priority Data

Dec. 30, 2005 (DE) .......................... 10 2005 063 130

(51) Int. Cl.
*H01L 21/76* (2006.01)
(52) U.S. Cl. ........................ 438/424; 438/795
(58) Field of Classification Search .................. 438/424, 438/795; 257/E21.545
See application file for complete search history.

(56) References Cited

U.S. PATENT DOCUMENTS

| | | | | |
|---|---|---|---|---|
| 4,582,764 A | * | 4/1986 | Allerd et al. ............... | 428/623 |
| 2004/0119135 A1 | * | 6/2004 | van Bentum et al. ........ | 257/510 |
| 2004/0212035 A1 | | 10/2004 | Yeo et al. ..................... | 257/510 |
| 2006/0121688 A1 | * | 6/2006 | Ko et al. ..................... | 438/439 |
| 2006/0138946 A1 | * | 6/2006 | Wang et al. .................. | 313/506 |
| 2007/0117408 A1 | * | 5/2007 | Nguyen et al. ............... | 438/780 |
| 2007/0132054 A1 | * | 6/2007 | Arghavani et al. ............ | 257/506 |
| 2007/0148881 A1 | * | 6/2007 | Tseng et al. ................. | 438/296 |
| 2008/0090379 A1 | * | 4/2008 | Buehrer et al. .............. | 438/435 |
| 2008/0145998 A1 | * | 6/2008 | Delgadino et al. ........... | 438/401 |
| 2008/0268597 A1 | * | 10/2008 | Wei et al. ..................... | 438/275 |

OTHER PUBLICATIONS

Ishibashi et al., "Novel Shallow Trench Isolation Process from Viewpoint of Total Strain Process Design for 45 nm Node Devices and Beyond," *Japanese Journal of Applied Physics*, 44:2153-56, 2005.

* cited by examiner

*Primary Examiner* — Bradley K Smith
(74) *Attorney, Agent, or Firm* — Williams, Morgan & Amerson, P.C.

(57) ABSTRACT

By locally heating isolation trenches with different annealing conditions, a different magnitude of intrinsic stress may be obtained in different isolation trenches. In some illustrative embodiments, the different anneal temperature may be achieved on the basis of an appropriate mask layer, which may provide a patterned optical response for a lamp-based or laser-based anneal process. Consequently, the intrinsic stress of isolation trenches may be specifically adapted to the requirements of circuit elements, such as N-channel transistors and P-channel transistors.

29 Claims, 4 Drawing Sheets

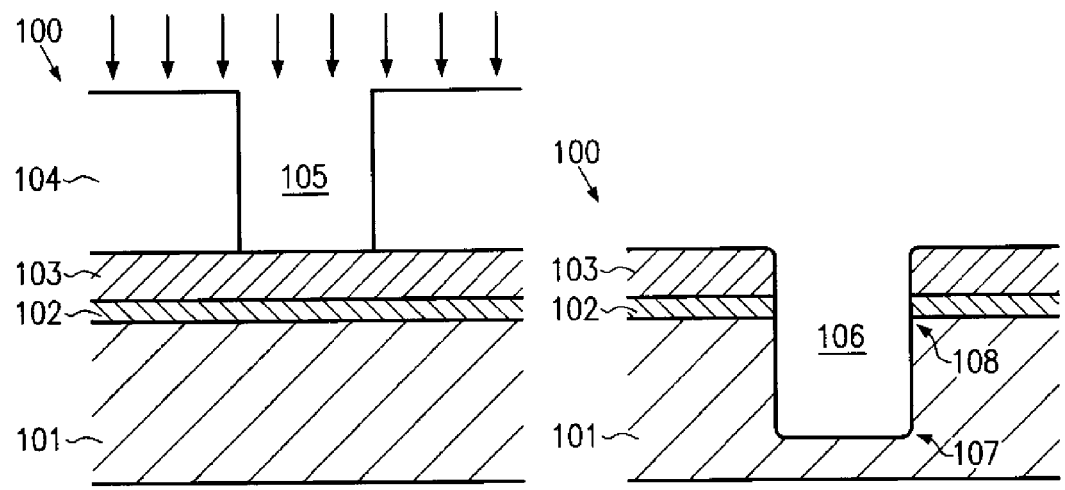
FIG.1a (prior art)
FIG.1b (prior art)
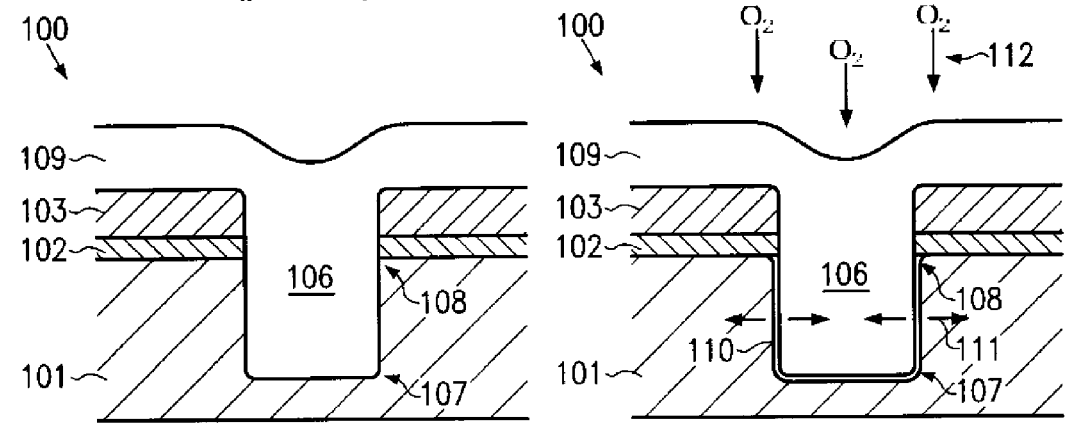
FIG.1c (prior art)
FIG.1d (prior art)
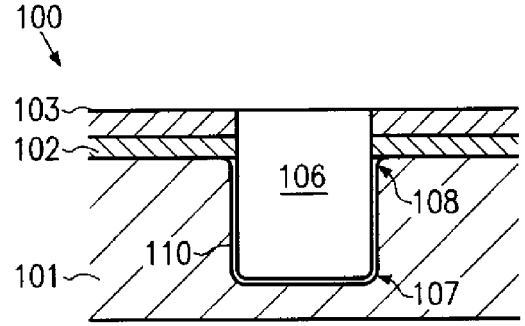
FIG.1e (prior art)

TRENCH ISOLATION STRUCTURE HAVING DIFFERENT STRESS

BACKGROUND OF THE INVENTION

1. Field of the Invention

Generally, the present invention relates to the field of semiconductor device manufacturing, and, more particularly, to trench isolation structures typically employed in sophisticated semiconductor devices to electrically insulate neighboring circuit elements from each other.

2. Description of the Related Art

The ongoing trend in continuously improving the performance of microstructures, such as integrated circuits, not only requires a steady decrease in the feature sizes of the circuit elements but also requires a structure that reliably electrically insulates adjacent circuit elements from each other, wherein the available chip area for manufacturing isolation structures decreases as the feature sizes of the circuit elements are reduced and the number thereof is increased. For integrated circuits having circuit elements with a feature size of approximately 1 µm and less, the well-established isolation structure, such as the LOCOS (local oxidation of silicon) structure, is preferably replaced by less space-consuming and more reliable trench isolation structures requiring the formation of a vertical trench enclosing a circuit element under consideration. In addition to the reduction of chip area occupied by the trench isolation structure compared to the LOCOS structure, the former structure provides a substantially planar surface for subsequent photolithographic processes, thereby significantly improving the resolution of the photolithographic process compared to the strongly varying topography of the LOCOS structure.

Although the introduction of trench isolation structures into the manufacturing process of integrated circuits significantly enhances device reliability in combination with an increased package density, certain issues arise in manufacturing trench isolation structures, especially when the dimensions of the isolation structure and the associated circuit elements approach the deep sub-micron regime. For dimensions of this order of magnitude, relatively high electrical fields may be created on sharp corners of the trench isolation structures and may therefore affect the operation of the circuit elements, such as field effect transistors and capacitors and the like, finally resulting in an increased leakage current between adjacent circuit elements. The formation of a trench isolation structure generally requires the employment of photolithography and anisotropic etch techniques where, in particular, upper corners of the trenches exhibit, due to the anisotropic etch process, relatively sharp corners that may not be sufficiently rounded by controlling process parameters of the etch process. Therefore, it has become standard practice to form a thermally grown oxide on inner surfaces of the trench to provide an increased radius of curvature, especially of the upper corners of the isolation trenches, wherein, however, an increased thickness of the thermally grown oxide entails additional compressive stress, which in turn may adversely affect device characteristics of the adjacent circuit element.

With reference to FIGS. 1a-1e, the fabrication of a conventional isolation structure is described in more detail. In FIG. 1a, a semiconductor structure 100 comprises a substrate 101, for example a semiconductor substrate, such as a silicon wafer, or a dielectric substrate bearing a semiconductor layer, such as a silicon-on-insulator (SOI) substrate. An oxide layer 102 is formed over the substrate 101, for example in the form of a silicon dioxide, followed by a further dielectric layer 103, the material composition of which may be preferably selected so as to serve as a stop layer during a chemical mechanical polishing (CMP) process required in a further advanced manufacturing stage. For example, the layer 103 may be provided as a silicon nitride layer. A resist mask layer 104 is formed over the silicon nitride layer 103 having formed therein an opening 105, the dimensions of which substantially represent the dimensions of a trench to be formed in the substrate 101. It should be noted that, depending on the type of photolithography technique employed, the resist mask 104 may comprise an anti-reflective coating to enhance the resolution of the photolithography step.

A typical process flow for forming the semiconductor structure 100 may include the following processes. The oxide layer 102 may be formed by a conventional oxidation process or may be deposited by chemical vapor deposition (CVD) techniques from appropriate precursor gases. Next, the silicon nitride layer 103 is deposited, followed by applying a resist layer that is subsequently patterned by photolithography to form the opening 105. The lateral dimensions of the opening 105 may depend on the specific design of the circuit to be formed and may require advanced photolithography techniques when, for instance, feature sizes in the range of approximately 0.2 µm and less are to be manufactured.

FIG. 1b schematically shows the semiconductor structure 100 with a trench 106 formed in the silicon nitride layer 103, the oxide layer 102 and partially in the substrate 101. The trench 106 has bottom corners or edges 107 which exhibit a rounding or a radius of curvature that depends on the specifics of the anisotropic etch process. On an upper portion of the trench, however, the interface between the oxide layer 102, the substrate 101 and the trench 106, as indicated by 108, will form a relatively sharp corner or edge which may not be easily rounded during the etch process, due to the characteristics of the anisotropic etch process. Since sharp corners, e.g., the areas 108, may entail, upon application of a voltage, relatively strong electrical fields in areas adjacent to the trench 106, respective counter-measures are usually taken to round the corners 107 and especially the areas 108 to minimize any inadvertent impact on a circuit element manufactured near the isolation trench 106, such as a field effect transistor.

Therefore, a thermal oxide liner is generally grown on inner surfaces of the trench 106 in order to especially provide a larger radius of curvature at the areas 108 at the interface between the dielectric silicon dioxide 102 and the material of the substrate 101. It turns out, however, that growing a thermal oxide within the trench 106 and subsequently depositing a bulk oxide for filling the trench 106 with a dielectric material may result in a reduced quality of the deposited oxide having a higher etch rate adjacent to the thermal liner oxide, thereby possibly leading to the creation of notches during the removal of the silicon nitride layer 103. Consequently, in some approaches a so-called "late liner" process is employed, in which the bulk oxide is deposited prior to forming the thermal oxide within the trench 106.

FIG. 1c schematically shows the semiconductor structure 100 with a silicon dioxide layer 109 formed over the trench 106 to an extent that the trench 106 is reliably filled at least up to the silicon nitride layer 103. Appropriate deposition techniques, such as chemical vapor deposition with precursor gases TEOS, oxygen and ozone at a temperature range of approximately 350-650° C. may be employed to fill the trench 106 substantially without the creation of any voids therein.

FIG. 1d schematically shows the semiconductor structure 100 with a thermal oxide layer 110 formed on oxidizable inner surfaces of the trench 106, wherein particularly the rounding at the areas 108 is significantly increased.

The thermal oxide layer 110 may be formed by exposing the substrate 101 to an oxidizing ambient 112 at an elevated temperature wherein simultaneously the dielectric oxide material of the layer 109 is densified. By appropriately adjusting the process parameters of the oxidation process, a thickness of the thermal oxide layer 110 may be adjusted in accordance with design requirements. Although an increased thickness of the thermal oxide layer 110 is advantageous in view of increasing the rounding, i.e., the radius of curvature, of the areas 108, it turns out, however, that a mechanical stress 111 is created within the trench 106, since the volume of the thermal oxide created in the layer 110 exceeds the volume of the consumed silicon of the substrate 101. The mechanical stress 111 induced by the growth of the thermal oxide layer 110 may, however, negatively affect the device characteristics of adjacent circuit elements, for example by producing lattice damage in the crystalline structure, and may even increase when high temperature anneal cycles are carried out during the further manufacturing steps.

In other approaches, the insulating material is annealed in a substantially inert ambient when the thermal oxide liner 110 has been formed prior to filling the trench 106 with the insulating material. Also, in this case, the anneal process may have a significant influence on the finally obtained stress of the isolation trench 106. Therefore, a trade-off has to be made regarding the required degree of rounding the areas 108, the required degree of oxide densification and the amount of acceptable mechanical stress 111 created by the thermal oxide layer 110. Since a plurality of different circuit elements having a different sensitivity to undesired electric fields and compressive stress is usually manufactured in an integrated circuit, the isolation trenches 106 represent a compromise for the most sensitive type of circuit elements.

FIG. 1e schematically shows the semiconductor structure 100 after the removal of excess material of the oxide layer 109 by chemical mechanical polishing (CMP). The thickness of the silicon nitride layer 103, acting as a CMP stop layer, is also reduced during the CMP, wherein the initial thickness of the silicon nitride layer 103 is selected so as to substantially ensure the integrity of the substrate 101 across the entire substrate surface. Subsequently, the residual silicon nitride layer 103 and thereafter the oxide layer 102 may be removed by appropriate wet chemical etch processes (not shown).

In view of the problems resulting from the trade-off in forming the isolation trench, a need exists to provide a technique for the formation of trench isolation structures which allows a higher degree of flexibility in adapting the trench isolation to a specific circuit element while avoiding one or more of the problems identified above or at least reducing the effects thereof.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a trench isolation structure having isolation trenches of different intrinsic stress. For this purpose, the annealing process may be performed in a localized manner in order to provide different annealing conditions at different isolation trenches, thereby generating a different type or at least a different magnitude of intrinsic stress.

According to one illustrative embodiment of the present invention, a method comprises forming a first isolation trench and a second isolation trench in a semiconductor layer located above a substrate, wherein the first and second isolation trenches are filled with an insulating material. Moreover, the method comprises heat treating the first and second isolation trenches differently for generating a first stress in the first isolation trench and a second stress in the second isolation trench, wherein the first stress is different from the second stress.

According to another illustrative embodiment of the present invention, a semiconductor device comprises a first isolation trench filled with an insulating material that has a first intrinsic stress. The semiconductor device further comprises a second isolation trench having substantially the same configuration and being filled with an insulating material that has a second intrinsic stress other than the first intrinsic stress.

BRIEF DESCRIPTION OF THE DRAWINGS

The invention may be understood by reference to the following description taken in conjunction with the accompanying drawings, in which like reference numerals identify like elements, and in which:

FIGS. 1a-1e schematically show cross-sectional views of a semiconductor structure containing a conventional isolation trench during various manufacturing stages;

Figure 2A:
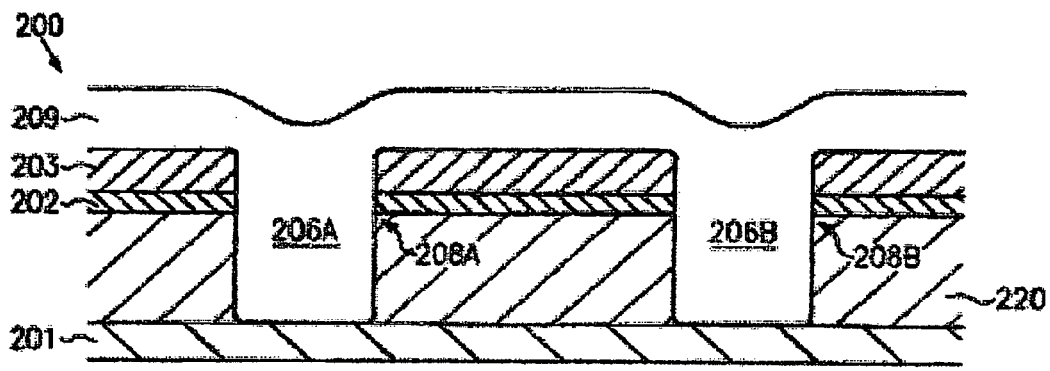
FIGS. 2a-2e schematically show cross-sectional views of an isolation structure having two different isolation trenches with different intrinsic stress due to different annealing conditions in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention relates to a technique for forming a semiconductor device having isolation trenches with different intrinsic stress, thereby enhancing the performance of respective circuit elements positioned next to the respective isolation trenches, as the associated intrinsic stress of the isolation trench may be adjusted on the basis of requirements for enhanced performance of the circuit element in question. For example, in advanced applications, strain engineering is frequently used to enhance charge carrier mobility and thus performance of field effect transistors by generating a certain type of strain in the channel region of the field effect transistor. Since the stress provided in the isolation trenches may also contribute to the resulting strain in the respective channel region, an appropriate adjustment of the intrinsic stress in the isolation trench may therefore significantly influence the efficiency of the strain generating mechanism in the channel region.

The present invention provides an efficient technique in which a heat treatment or annealing process is, at least for a certain time period, applied in a localized manner in order to locally adjust one or more device characteristics. In conventional techniques for forming isolation trenches, one or more heat treatments or annealing processes are performed commonly for the entire substrate in order to adjust certain properties, such as corner rounding, density of the insulating material and the like. According to the present invention, at least temporarily, corresponding heat treatments may be performed on the basis of annealing techniques which allow an energy deposition in a highly localized fashion, such as lamp-based annealing processes or laser-based techniques, wherein the material characteristics in or above respective isolation trenches may be appropriately selected to obtain a locally varying energy deposition and thus locally varying annealing conditions. For example, in some illustrative embodiments, the surface characteristics of a material exposed to the lamp or laser radiation may be adjusted so as to locally adapt the energy absorption or reflectivity. For this purpose, in some embodiments, an appropriately patterned layer having suitable absorbing or reflective characteristics with respect to the radiation used may be provided, thereby enabling an efficient local heat treatment, while maintaining a high degree of process flexibility for the formation of the isolation trenches, since the "annealing pattern" may be obtained substantially independent from any specific trench configurations by, for instance, providing a sacrificial mask layer which may be removed after the local heat treatment. In still other illustrative embodiments, manufacturing processes for the isolation trench may be suitably combined with the process for forming a respective annealing mask, as will be described in more detail later on.

With reference to FIGS. 2a-2e, further illustrative embodiments of the present invention will now be described in more detail. In FIG. 2a, a semiconductor device 200 comprises a substrate 201, which may be a semiconductor bulk substrate, such as a silicon substrate, that is appropriate for the formation of silicon-based circuit elements. In other embodiments, the substrate 201 may comprise other semiconductor materials, such as germanium, gallium arsenide or various types of II-VI or III-V semiconductors. Moreover, the substrate 201 may represent any appropriate substrate that includes at least a layer of semiconducting material in which circuit elements may be formed. In one embodiment, the substrate 201 may represent an SOI substrate in which a semiconductor layer 220 is provided above a buried insulating layer (not shown), such as a silicon dioxide layer, which is also referred to as buried oxide. Since the vast majority of integrated circuits are presently manufactured on the basis of silicon, in the following the substrate 201 will be referred to as a silicon substrate, which forms upon exposure to an oxidizing ambient silicon dioxide. It should be appreciated, however, that the present invention should not be restricted to any specific semiconductor material or substrate configuration unless such details are explicitly set forth in the following embodiments or the appended claims.

The semiconductor device 200 further comprises a first trench 206A and a second trench 206B, which, in one illustrative embodiment, may have substantially the same configuration, while, in other embodiments, the trenches 206A and 206B may differ in their dimensions in accordance with design requirements. It should be appreciated that the trenches 206A, 206B may represent isolation trenches at very different areas of the substrate 201 or, as in the example shown in FIG. 2a, may represent isolation trenches that are in close proximity to each other. The trenches 206A and 206B may each enclose a corresponding "active" portion of the semiconductor layer 220, in which respective circuit elements, such as field effect transistors and the like, are to be formed. An insulating layer 202, e.g., silicon dioxide, may be formed above the substrate 201 followed by a further dielectric layer 203 having characteristics that allow the layer 203 to serve as a stop layer in a subsequent CMP process. The layer 203 may, for example, be comprised of silicon nitride. A layer of a dielectric oxide material 209 is formed above the layer 203 so as to substantially completely fill the trenches 206A, 206B. The trenches 206A, 206B have upper corner areas indicated by 208A, 208B, respectively. It should be appreciated that the trench configuration depicted in FIG. 2a is of illustrative nature only, and other configurations may also be used in accordance with the present invention. For example, the insulating layer 202 may not necessarily be provided, or the stop layer 203 and optionally the insulating layer 202 may also be provided within the trenches 206A, 206B.

Regarding a typical process flow for forming the semiconductor structure 200 as shown in FIG. 2a, similar processes may be employed as already explained with reference to FIGS. 1a-1c. In case the substrate 201 is to represent an SOI substrate, the trenches 206A, 206B may extend down to and possibly into the buried oxide layer (not shown). After the deposition of the dielectric layer 209, in one embodiment, a thermal treatment may be carried out in an inert ambient containing, for example, nitrogen and/or argon and the like to densify the dielectric material 209. A temperature of the thermal treatment may range from approximately 700-1350° C. The thermal treatment may be performed such that specific characteristics, such as the degree of densification of the material of the layer 209 and the like, may be appropriate for one of the trenches, for instance the trench 206A, while the other trench is to receive a further thermal treatment, which may affect the first trench 206A significantly less. In other embodiments, a common thermal treatment for the trenches 206A, 206B may be performed in an oxidizing ambient to form respective oxide liners, thereby enhancing the corner rounding, in particular at the upper corners or edges 208A, 208B. In other embodiments, a common heat treatment for both trenches 206A, 206B may not be performed and the respective trench characteristics may be adjusted substantially on the basis local annealing conditions, as will be described later on.

In still other illustrative embodiments, the isolation trenches 206A, 206B may be filled with any appropriate material wherein, for instance, non-oxidizable spacer elements (not shown) may be formed on respective sidewall portions of the trenches 206A, 206B in accordance with device requirements. It should be appreciated that any other appropriate process techniques may be used for the formation of the isolation trenches 206A, 206B and filling the same, as long as a subsequent thermal treatment or annealing process may significantly alter the stress characteristics of the isolation trenches 206A, 206B. For example, a plurality of dielectric materials may be densified upon a thermal treatment, thereby resulting in a corresponding volume reduction, which may then lead to a difference in the finally obtained intrinsic stress.

Figure 2B:
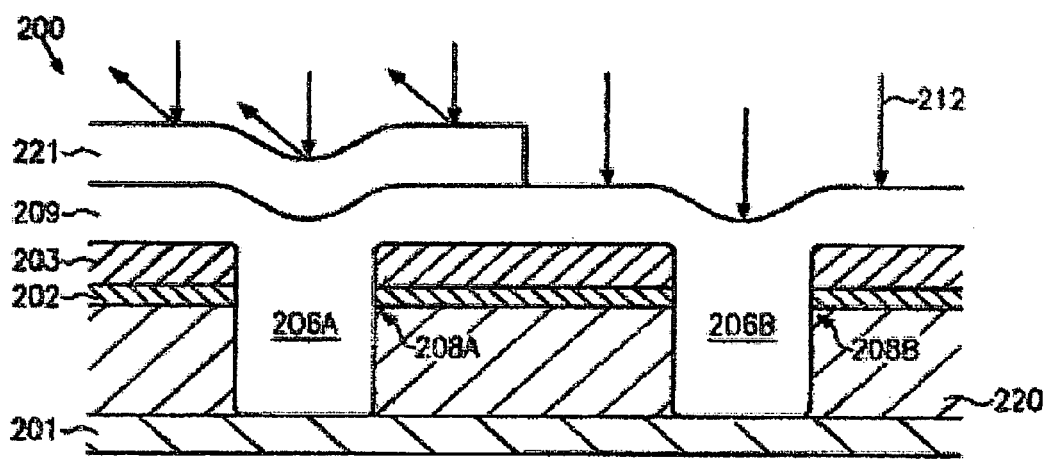

FIG. 2b schematically shows the semiconductor device 200 in a further advanced manufacturing stage. A mask layer 221 may be spatially selectively formed above the semiconductor device 200 in order to expose the second isolation trench 206B, while covering the first isolation trench 206A. In the embodiment shown, the mask layer 221 may be comprised of any appropriate material that has a desired characteristic so as to efficiently modify the heat dissipation characteristics of the region located below the mask layer 221 during an annealing process 212. In one illustrative embodiment, the annealing process 212 is performed on the basis of an energy containing radiation, such as electromagnetic radiation including an appropriate wavelength range, as may be obtained on the basis of appropriate radiation lamps or laser-based radiation sources. In order to efficiently locally modify the heat dissipation behavior of the device 200, the mask layer 221 may provide an enhanced radiation absorption or reflectivity, depending on process specifics. In the embodiment shown, the mask layer 221 may be provided as a material layer having a high reflectivity, at least for a specified wavelength range of the heat inducing radiation of the process 212, which conveys a substantial amount of the total energy. For example, depending on the wavelength used in the radiation sources, the mask layer 221 may be comprised of a dielectric material the optical characteristics of which may be adjusted so as to obtain a high degree of back reflection for the specified wavelength range. In this way, the heat dissipation into the underlying device regions and thus the trench 206A is significantly reduced compared to the non-covered portion of the device 200, thereby efficiently heating the material within the trench 206B, while providing a significantly reduced temperature within the trench 206A. In some embodiments, the mask layer 221 may include a plurality of different layers which, in combination, may provide the desired high reflectivity, for instance by alternately providing a difference in the refractive index and the like. In still other embodiments, the mask layer 221 may be provided as a refractory metal layer, which may exhibit a high degree of reflectivity over a wide wavelength range so that a high difference in temperature may be generated between the first trench 206A and the second trench 206B during the annealing process 212. Since the duration of the annealing process 212 may range, in some embodiments, from approximately 5-60 seconds, an efficient heat transfer from the non-covered region, i.e., the region corresponding to the second trench 206B, to the respective covered region, i.e., the region corresponding to the trench 206SA, may not occur, thereby maintaining a high temperature difference and also a high degree of integrity of the mask layer 221 when this layer is provided in the form of a metal layer.

It should be appreciated that in FIG. 2b the semiconductor device 200 is shown to have the layer 209 as deposited, wherein the mask layer 221 is formed above the non-planarized layer 209. In other embodiments, as will be described in more detail with reference to FIG. 2c, excess material of the layer 209 may be removed, for instance by CMP, in accordance with conventional process strategies, and the mask layer 221 may be formed on the planarized surface topography, thereby enhancing the efficiency of any photolithography process used for patterning the mask layer 221.

Figure 2C:
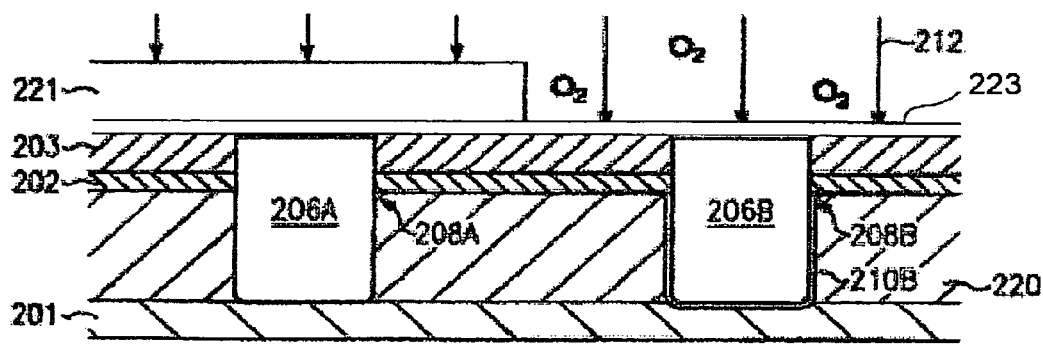

FIG. 2c depicts an alternative process flow. When the mask layer 221 is highly reflective so that the trench 206B is heated to an elevated temperature, similarly as in FIG. 2b, in one illustrative embodiment, an oxidizing ambient may be established to form a thermal oxide layer 210B within the second trench 206B. Consequently, due to the thermal oxide layer 210B, an increased corner rounding at the upper portions 208B may be achieved, while on the other hand an increased compressive stress may be generated due to the additional growth of oxide material in the layer 210B. A corresponding increased compressive stress may be advantageous for the formation of respective field effect transistors, such as P-channel transistor elements, wherein the compressive stress generated by the layer 210B may be efficiently transferred into a respective channel region, thereby enhancing the charge carrier mobility of holes in the P-channel field effect transistor. On the other hand, the mask layer 221 may efficiently suppress any oxygen diffusion into the first isolation trench 206A and may also provide a significantly lower temperature during the annealing process 212. It should be appreciated that, depending on device strategy, a common anneal process may have been performed prior to the formation of the mask layer 221, wherein a corresponding oxidizing ambient may also have been established to commonly form respective thermal oxide liners in both trenches 206A, 206B, while the corresponding thermal oxide liner may then be further grown in the second isolation trench 206B on the basis of the mask 221. Similarly, a further anneal process may be performed after removal of the mask layer 221 wherein, depending on device requirements, an oxidizing ambient may be established or not so as to also provide a desired material densification in the first trench 206A, possibly in combination with the formation of a respective thermal oxide liner, while the respective liner 210B may further grow in the second isolation trench 206B.

After the annealing process 212, the mask layer 221 may be removed, which may be accomplished, in some illustrative embodiments, on the basis of an etch stop layer 223 which may be formed prior to the deposition of the mask layer 221 and which may also be efficiently used during the patterning of the mask layer 221. In other illustrative embodiments, the material of the layer 203 as well as the dielectric oxide material of the layer 209 may exhibit a required high etch selectivity with respect to the material of the layer 221 so as to enable the patterning and the removal of the mask layer 221 without any additional etch stop layer. For example, the mask layer 221 may be provided in the form of a silicon layer, which may be etched with high selectivity with respect to silicon dioxide and silicon nitride. Similarly, when providing the mask layer 221 in the form of a refractory metal, well-established selective etch recipes are available to pattern and remove the refractory metal from silicon nitride and silicon dioxide. Moreover, during the anneal process 212, a chemical reaction between a refractive metal, such as tungsten, cobalt, nickel, silver, platinum and the like, may be efficiently suppressed, thereby substantially avoiding any undue effect of the refractory metal on the lower lying device regions.

Figure 2D:
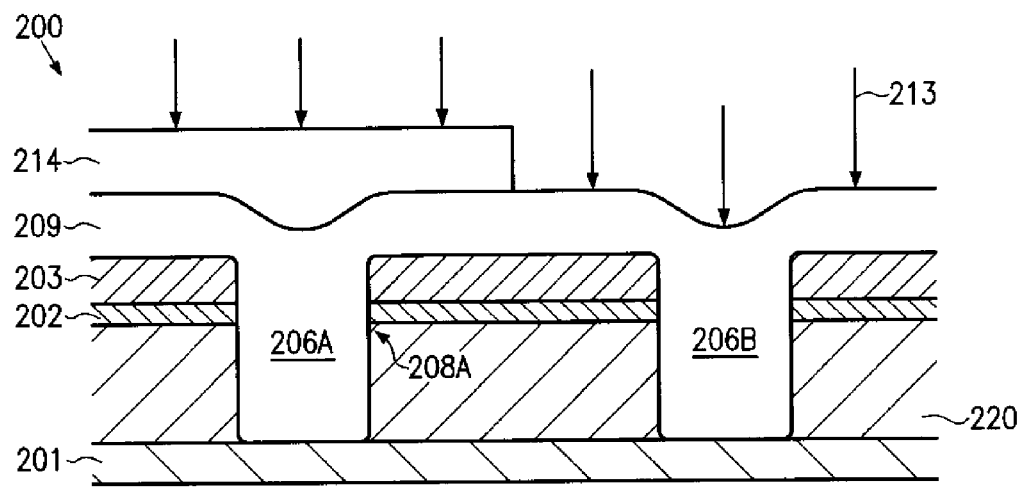

FIG. 2d schematically shows the semiconductor device 200 in accordance with still other illustrative embodiments, in which a modification of the optical behavior of material above the first and second isolation trenches 206A, 206B may be accomplished on the basis of a resist mask 214 and an ion implantation process 213, which may be designed to significantly modify the internal structure of a material located above the second trench 206B. In the embodiment shown, the layer 209 itself may be deposited with a significant amount of excess material, which may then be correspondingly modified on the basis of the ion implantation process 213. The implantation process 213 may be performed on the basis of any appropriate ion species, such as heavy ions in the form of xenon, silicon, germanium, and any other appropriate species. Due to the ion bombardment, the crystalline structure of the layer 109 may be significantly modified, thereby also significantly modifying the refractive index and/or the extinction coefficient of the layer 209. Moreover, due to the deposition of specific materials within the layer 209, the reflectivity or absorbance of the layer 209 may also be significantly altered, wherein the modified molecular structure may also affect the heat transfer characteristics of the material. After the material modification by means of the process 213, the resist mask 214 may be removed and the annealing process 212 may be performed as is described above wherein, for instance, the ion implantation 213 may be designed to significantly enhance the absorption and heat transfer characteristics of the modified layer portion located above the second isolation trench 206B, thereby also providing for an increased anneal temperature therein. Thereafter, the excess material of the layer 209 may be efficiently removed by any appropriate technique, such as CMP, in accordance with any conventional techniques.

Figure 2E:
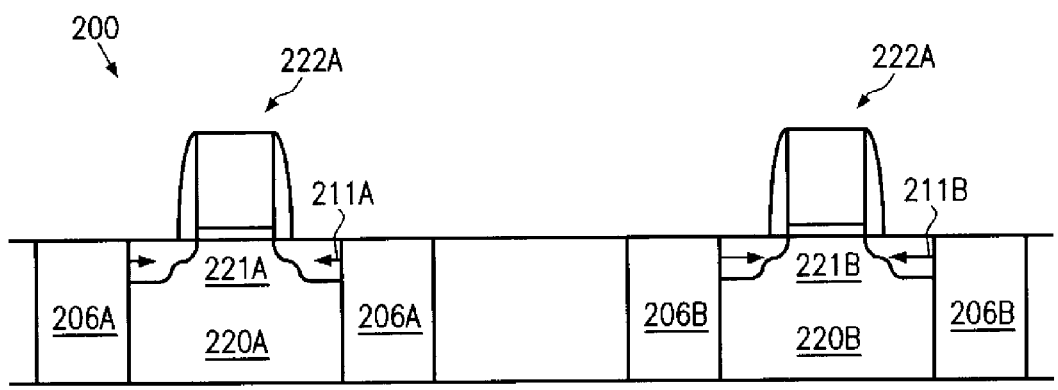

FIG. 2e schematically shows the semiconductor device 200 in a further advanced manufacturing stage. The device 200 has formed in and on respective active regions 220A, 220B, defined by the respective isolation trenches 206A, 206B within the semiconductor layer 220, corresponding circuit elements 222A, 222B, which, in one illustrative embodiment, may represent field effect transistors. Due to the preceding manufacturing sequence including the anneal process 212 that provides locally different annealing conditions, the isolation trenches 206A, 206B may significantly differ in their intrinsic stress, wherein for convenience the intrinsic stress 211A of the first isolation trench 206A is illustrated as being significantly less than the corresponding compressive stress of the second isolation trench 206B. Since the respective intrinsic stresses may also significantly contribute to the overall strain created in the respective channel regions 221A, 221B, the different intrinsic stresses 211A, 211B may be regarded as additional stress sources for an efficient strain engineering technique. For example, the transistor 222A may represent an N-channel transistor, in which tensile strain in the channel region 221A, which may be created by any appropriate source, such as sidewall spacers and the like, may result in a corresponding strain that may significantly enhance the electron mobility, thereby also improving the transistor performance. In this case, any additional compressive stress transferred to the channel region 221A may negatively influence the device performance and thus the significant reduction of a compressive stress during the formation of the isolation trench 206A, thereby resulting in the significantly reduced stress 211A, may enhance the overall strain engineering process. Similarly, the transistor 222B may represent a P-channel transistor, in which the isolation trench 206B may act as a stress source for inducing compressive stress in the respective channel region 221B, thereby significantly enhancing the charge carrier mobility of holes, which directly translates into a respective enhanced current drive capability. Consequently, the intrinsic stress 211B obtained by the preceding local annealing process 212 may be considered as a stress source, which may be used, possibly in combination, with further stress-inducing sources, such as embedded silicon/germanium layers within drain and source regions of the transistor 222B, or respective stressed sidewall spacers and/or contact etch stop layer still to be formed above the device 200, to act as an efficient means for providing compressive strain in the channel region 221B. Consequently, the field effect transistors 222A, 222B may be formed on the basis of well-established process techniques, possibly including further measures for creating a desired degree of strain in the respective channel regions 221A, 221B, while the local annealing process 212 provides the possibility to individually adapt the strain obtained by the respective intrinsic stress of the isolation trench so that a high degree of design flexibility is provided. Moreover, due to effective strain engineering on the basis of a local heat treatment during the formation of the isolation trenches 206A, 206B, a high degree of compatibility with well-established process techniques may also be maintained without significantly contributing to additional process complexity.

Figure 3A:
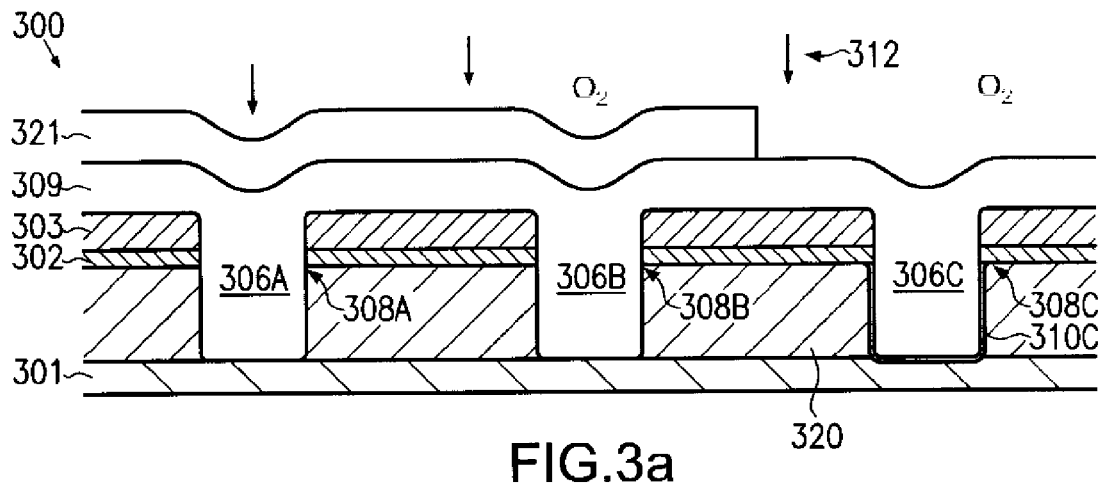
FIGS. 3a-3c schematically show cross-sectional views of an isolation structure having a plurality of isolation trenches each of which is treated with different annealing conditions in accordance with still other illustrative embodiments of the present invention.
Figure 3B:
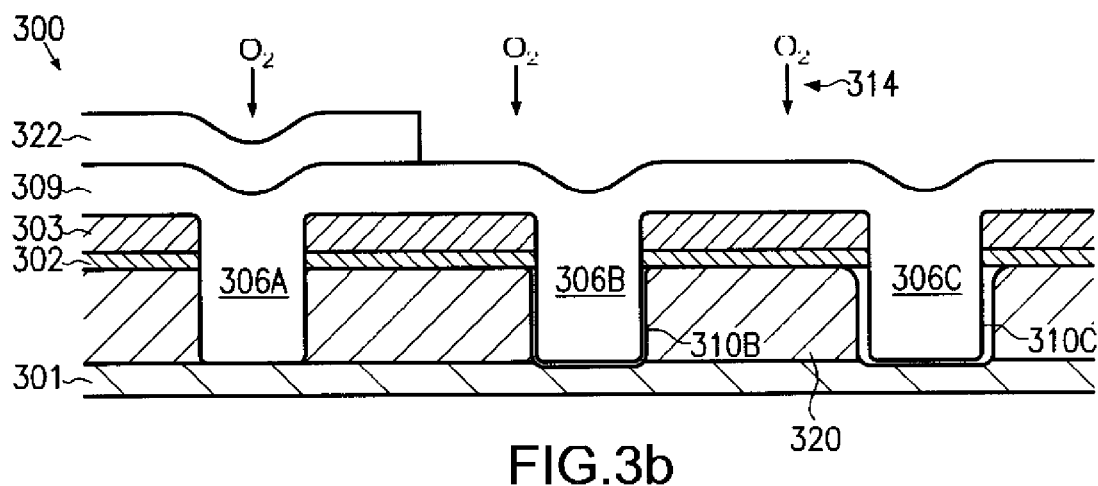
Figure 3C:
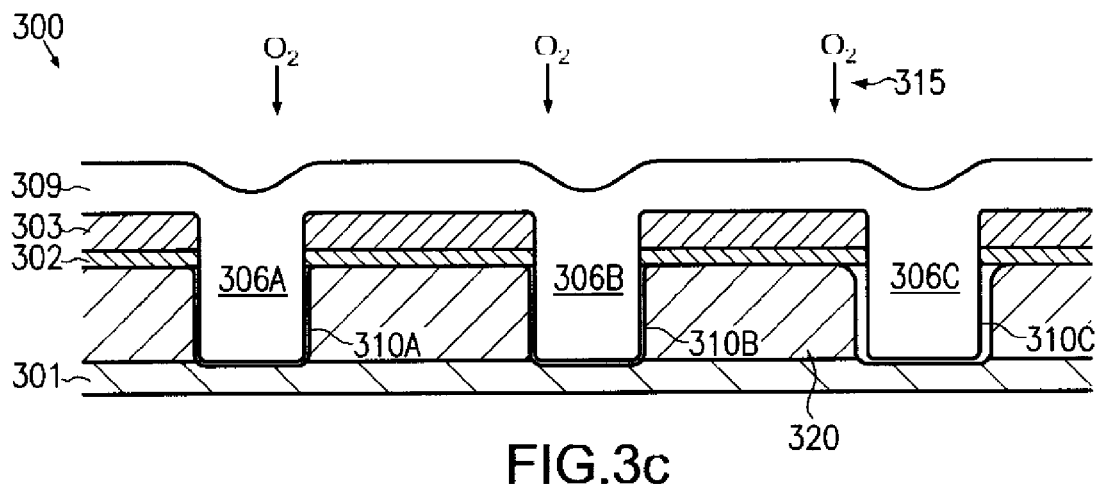

With reference to FIGS. 3a-3c, further illustrative embodiments of the present invention will now be described in more detail. In FIG. 3a, a semiconductor device 300 comprises a plurality of isolation trenches which, in the present example, are represented by three isolation trenches 306A, 306B, 306C, which are formed in a semiconductor layer 320 that is located above a substrate 301. The isolation trenches 306A, 306B, 306C may have the same configuration or may differ in their dimensions, depending on process requirements. Moreover, the isolation trenches 306A, 306B, 306C may be located at different device regions within the substrate 301, wherein, in some illustrative embodiments, the isolation trenches 306A, 306B, 306C may be located within a single die region, whereas, in other illustrative embodiments, at least some of the isolation trenches 306A, 306B, 306C may be located in different die regions so as to enable the performing of a stress engineering for the respective isolation trenches on a highly global manner, thereby, for instance, taking into consideration across-substrate non-uniformities. As in the embodiments described before, an insulating layer 302 followed by a CMP stop layer 303 may be formed above the semiconductor layer 320 wherein, as previously explained, any other appropriate manufacturing scheme for the formation of isolation trenches may also be used in accordance with the present invention. Furthermore, in this manufacturing stage, an insulating layer 309 may be deposited above the device 300 to substantially completely fill each of the isolation trenches 306A, 306B, 306C.

With respect to the various components of the device 300, it may be referred to the corresponding components as explained with reference to the devices 100 and 200. Moreover, a mask layer 321 is formed above the device 300 to cover the isolation trenches 306A, 306B, while exposing the isolation trench 306C. The mask layer 321 may be configured to exhibit a high reflectivity with respect to a specified radiation wavelength used in an anneal process 312, whereas, in other illustrative embodiments, the mask layer 321 may act as an efficient radiation absorption layer to enhance heat transfer to any regions located below the mask layer 321. For example, in the former case, the mask layer 321 may be provided as any appropriate material, such as a refractory metal, or any other appropriate dielectric or conductive material that may have a moderately high reflectivity for a specified wavelength range, for instance in the wavelength range of optical and infrared radiation as is frequently used for lamp-based and laser-based anneal techniques. Consequently, during the annealing process 312, the isolation trench 306C may receive an increased amount of energy provided by the radiation of the annealing process 312 due to the significantly reduced reflectivity compared to the mask layer 321. Consequently, a certain degree of densification may occur in the isolation trench 306C, while the trenches 306A, 306B may experience a significantly lower temperature.

It should be appreciated that, prior to or after the anneal process 312, a common heat treatment may be performed to commonly heat all of the trenches 306A, 306B, 306C, when a certain "baseline" densification is desired. In still other embodiments, the successive application of the annealing process 312 with differently patterned mask layers may be sufficient to provide a required certain amount of heat treatment in each of the isolation trenches 306A, 306B, 306C. In one illustrative embodiment, the heat treatment 312 may be performed in an oxidizing ambient, thereby efficiently forming a corresponding thermally grown oxide layer 310C in the respective trench 306C. In other embodiments, the heat treatment 312 may be performed in a substantially inert ambient so as to substantially avoid any formation of an oxide layer, wherein a desired degree of corner rounding may be achieved by other means, for instance by forming a respective oxide layer and removing the same prior to the deposition of the layer 309. However, any other appropriate manufacturing regime may be used in combination with the present invention. Moreover, as previously explained, the mask layer 321 may comprise an appropriate etch stop layer, when the etch selectivity of the layer 309 is considered inappropriate for the material of the layer 321. In still other illustrative embodiments, the layer 309 may be planarized prior to the formation of the mask layer 321, which may be accomplished with or without an appropriate etch stop layer, as is also previously explained.

FIG. 3b schematically illustrates the semiconductor device 300 in a further advanced manufacturing stage, in which the mask layer 321 may have been re-patterned to also expose the isolation trench 306B, while still covering the trench 306A. A corresponding patterning process may be accomplished on the basis of well-established photolithography techniques. In other illustrative embodiments, the mask layer 321 may be removed and a new mask layer 322 may be formed on the basis of established deposition and lithography techniques. Thus, a further heat treatment 314 on the basis of an appropriate radiation source may be performed wherein, for instance, as shown in FIG. 3b, the further heat treatment 314 may be performed in an oxidizing ambient when a further increased thickness of the oxide layer 310C and the formation of a respective oxide layer 310B in the trench 306B is desired. It should be emphasized that one or both of the heat treatments 312, 314 may be performed in an inert ambient to substantially suppress the formation of a respective oxide layer.

FIG. 3c schematically illustrates the semiconductor device 300 in a further advanced manufacturing stage, in which a further heat treatment 315 may be performed, if desired, to also impart a certain degree of heat treatment to the first isolation trench 306A, if a corresponding heat treatment is desired. For example, the heat treatment 315 may be performed in the presence of oxygen, thereby also providing a certain degree of corner rounding by means of a corresponding oxide layer 310A. Hereby, the respective oxide layers 310B, 310C may correspondingly increase, depending on the duration of the heat treatment 315. It should be appreciated that the sequence of heat treatments 312, 314 and, if desired, 315 may be designed such that appropriate different degrees of annealing are achieved in the respective isolation trenches 306A, 306B, 306C. Additionally, a high degree of process flexibility is provided for the formation of an oxide layer in one or more of the respective isolation trenches so as to correspondingly provide for additional corner rounding and/or for additional compressive stress, depending on the device requirements. Consequently, the device 300 may have a plurality of isolation trenches with different intrinsic stress obtained by correspondingly "patterning" the heat transfer to respective isolation trenches on the basis of a correspondingly designed mask layer. It should be appreciated that the mask layers illustrated in FIGS. 3a-3b may be formed in accordance with the same criteria as previously explained with reference to the mask layer 321. Furthermore, all aspects for modifying respective materials as explained with reference to FIGS. 2a-2e also apply for the device 300. Consequently, corresponding circuit elements, such as field effect transistors, may be formed adjacent to the respective isolation trenches, thereby enhancing the strain-inducing mechanism in the respective circuit elements, as is also explained with reference to FIG. 2e. When two or more of the isolation trenches 306A, 306B, 306C represent different substrate regions, such as a central region and a peripheral region of the substrate 301, the present invention provides the possibility of globally adjusting the device performance, for instance by globally reducing or increasing the compressive stress created by the respective trench isolation structures, thereby influencing, for instance, the operating speed of the respective transistor elements. Similarly, large area regions within a single die may receive the locally differing anneal conditions in the processes 312, 314, thereby providing the possibility of efficiently modifying the stress in sensitive device regions, such as memory areas, for instance by providing a moderately high compressive stress, possibly in combination with a high degree of corner rounding, while in high speed areas such as a CPU core, low compressive stress may be provided at N-channel field transistors, while a high compressive stress may be provided at P-channel transistor elements, thereby additionally enhancing the speed of these devices.

As a result, the present invention enables the formation of trench isolation structures with different intrinsic stress by appropriately modifying the heat dissipation during a lamp-based or laser-based anneal process or otherwise radiation-induced heat transfer mechanism. For this purpose, material characteristics, such as reflectivity, absorption and the like, may be appropriately modified, in some illustrative embodiments, on the basis of respectively designed mask layers, to create a different temperature and thus a different degree of annealing during the respective heat treatment. Depending on the process specifics, a more or less pronounced densification, oxide layer formation and the like may be achieved, thereby also significantly affecting the resulting intrinsic stress of the isolation trenches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first isolation trench and a second isolation trench in a semiconductor layer, said first and second isolation trenches being filled with an insulating material;
forming a mask layer to cover said first isolation trench and expose said second isolation trench; and
heat treating said first and second isolation trenches by applying a heat generating radiation to said first and second isolation trenches in the presence of said mask layer to generate a first stress in said first isolation trench and a second stress in said second isolation trench different from said second stress, wherein said mask layer modifies a first heat dissipation into said first isolation trench arising from the heat generating radiation as compared to a second heat dissipation into said second isolation trench arising from the heat generating radiation, said first heat dissipation being different than said second heat dissipation.

2. The method of claim 1, wherein said mask layer is configured to absorb a substantial amount of energy contained in said heat generating radiation.

3. The method of claim 1, wherein heat treating said first and second isolation trenches comprises heat treating at least one of said first and second isolation trenches in an oxidizing ambient.

4. The method of claim 1, further comprising forming a thermal oxide on oxidizable inner surface portions of said first and second isolation trenches and filling said first and second isolation trenches with an insulating material.

5. The method of claim 1, wherein heat treating said first and second isolation trenches comprises commonly heating said first and second isolation trenches by a furnace process.

6. The method of claim 5, wherein heat treating said first and second isolation trenches further comprises annealing said first and second isolation trenches with at least one of a different temperature and a different duration.

7. The method of claim 5, wherein heat treating said first and second isolation trenches further comprises annealing said first and second isolation trenches with at least one of a different temperature and a different duration prior to said furnace process.

8. The method of claim 1, further comprising filling said first and second isolation trenches with said insulating material and removing excess material prior to forming said mask layer.

9. The method of claim 8, further comprising forming an etch stop layer above said first and second isolation trenches after removing said excess material and forming said mask layer above said etch stop layer.

10. The method of claim 1, wherein heat treating said first and second isolation trenches comprises modifying at least one characteristic of a material located above said first and second isolation trenches and irradiating said first and second isolation trenches through said material located above said first and second isolation trenches.

11. The method of claim 10, wherein said material located above said first and second isolation trenches is an excess portion of said insulating material.

12. The method of claim 10, wherein said material above said first and second isolation trenches is deposited after filling said first and second isolation trenches with said insulating material and removing excess portion of said insulating material.

13. The method of claim 10, wherein modifying at least one characteristic of said material comprises selectively implanting an ion species in said material.

14. The method of claim 1, further comprising forming a P-channel field effect transistor adjacent to said first isolation trench, wherein said first isolation trench has a compressive stress.

15. The method of claim 14, further comprising forming an N-channel field effect transistor adjacent to said second isolation trench, said second isolation trench having a compressive stress less than said first isolation trench.

16. A method, comprising:
forming a first isolation trench and a second isolation trench in a semiconductor layer, said first and second isolation trenches being filled with an insulating material;
forming a mask layer to cover said first isolation trench and expose said second isolation trench; and
heat treating said first and second isolation trenches by applying a heat generating radiation to said first and second isolation trenches in the presence of said mask layer to generate a first stress in said first isolation trench and a second stress in said second isolation trench different from said second stress, wherein said mask layer modifies a first heat dissipation into said first isolation trench arising from the heat generating radiation as compared to a second heat dissipation into said second isolation trench arising from the heat generating radiation, said first heat dissipation being different than said second heat dissipation, wherein said mask layer is configured to reflect a substantial amount of energy contained in said heat generating radiation.

17. The method of claim 16, wherein heat treating said first and second isolation trenches comprises heat treating at least one of said first and second isolation trenches in an oxidizing ambient.

18. The method of claim 16, further comprising forming a thermal oxide on oxidizable inner surface portions of said first and second isolation trenches and filling said first and second isolation trenches with an insulating material.

19. The method of claim 16, wherein heat treating said first and second isolation trenches comprises commonly heating said first and second isolation trenches by a furnace process.

20. The method of claim 19, wherein heat treating said first and second isolation trenches further comprises annealing said first and second isolation trenches with at least one of a different temperature and a different duration.

21. The method of claim 19, wherein heat treating said first and second isolation trenches further comprises annealing said first and second isolation trenches with at least one of a different temperature and a different duration prior to said furnace process.

22. The method of claim 17, further comprising filling said first and second isolation trenches with said insulating material and removing excess material prior to forming said mask layer.

23. The method of claim 22, further comprising forming an etch stop layer above said first and second isolation trenches after removing said excess material and forming said mask layer above said etch stop layer.

24. The method of claim 16, wherein heat treating said first and second isolation trenches comprises modifying at least one characteristic of a material located above said first and second isolation trenches and irradiating said first and second isolation trenches through said material located above said first and second isolation trenches.

25. The method of claim 24, wherein said material located above said first and second isolation trenches is an excess portion of said insulating material.

26. The method of claim 24, wherein said material above said first and second isolation trenches is deposited after filling said first and second isolation trenches with said insulating material and removing excess portion of said insulating material.

27. The method of claim 24, wherein modifying at least one characteristic of said material comprises selectively implanting an ion species in said material.

28. The method of claim 16, further comprising forming a P-channel field effect transistor adjacent to said first isolation trench, wherein said first isolation trench has a compressive stress.

29. The method of claim 28, further comprising forming an N-channel field effect transistor adjacent to said second isolation trench, said second isolation trench having a compressive stress less than said first isolation trench.

\* \* \* \* \*